(12) United States Patent
Gilbert et al.

(10) Patent No.: US 6,849,459 B2
(45) Date of Patent: Feb. 1, 2005

(54) MICROFLUIDIC CHIP FOR BIOMOLECULE CRYSTALLIZATION

(75) Inventors: John Gilbert, Brookline, MA (US); Jaishree Trikha, Waban, MA (US)

(73) Assignee: Cytonome, Inc., Watertown, MA (US)

( * ) Notice: Subject to any disclaimer, the term of this patent is extended or adjusted under 35 U.S.C. 154(b) by 0 days.

(21) Appl. No.: 10/328,931

(22) Filed: Dec. 23, 2002

(65) Prior Publication Data

US 2004/0048388 A1 Mar. 11, 2004

Related U.S. Application Data

(60) Provisional application No. 60/427,620, filed on Nov. 19, 2002, provisional application No. 60/410,685, filed on Sep. 13, 2002, and provisional application No. 60/409,489, filed on Sep. 9, 2002.

(51) Int. Cl.[7] .............................................. G01N 33/00
(52) U.S. Cl. ......................... 436/86; 436/4; 436/176; 436/178
(58) Field of Search ................................. 436/176–178, 436/86; 378/1, 73

(56) References Cited

U.S. PATENT DOCUMENTS

| | | | |
|---|---|---|---|
| 3,984,307 A | 10/1976 | Kamentsky et al. | |
| 4,175,662 A | 11/1979 | Zold | |
| 4,756,427 A | 7/1988 | Gohde et al. | |
| 5,104,478 A | 4/1992 | Sikdar et al. | |
| 5,271,795 A | 12/1993 | Ataka et al. | |
| 5,552,127 A | 9/1996 | Asano | |
| 5,716,852 A | 2/1998 | Yager et al. | |
| 5,837,200 A | 11/1998 | Diessel et al. | |
| 5,932,100 A | 8/1999 | Yager et al. | |
| 5,961,934 A | 10/1999 | Arnowitz et al. | |
| 5,997,636 A | 12/1999 | Gamarnik et al. | |
| 6,258,331 B1 | 7/2001 | Sanjoh | |
| 6,296,673 B1 | 10/2001 | Santarsiero et al. | |
| 6,319,315 B1 | 11/2001 | Sanjoh | |
| 6,406,903 B2 | 6/2002 | Bray et al. | |
| 6,409,832 B2 | 6/2002 | Weigl et al. | |
| 6,417,007 B1 | 7/2002 | Gittleman et al. | |
| 6,468,346 B2 | 10/2002 | Arnowitz et al. | |
| 2001/0027745 A1 * | 10/2001 | Weigl et al. | 117/206 |
| 2002/0164812 A1 * | 11/2002 | DeLucas | 436/86 |
| 2003/0061687 A1 * | 4/2003 | Hansen et al. | 23/295 R |
| 2003/0154910 A1 * | 8/2003 | David | 117/68 |

OTHER PUBLICATIONS http://www.ndif.org/Terms/protein_channel.html NDI Terminology, 1991.*
http://www.chem.wisc.edu/~newtrad/CurrRef/BDGTopic/lab/Crystlab.html, "Crystalline Solids", Dec. 2, 1998.*
PCMOS–Protein Crystallization Microfluidic Systems, Acta Cryst., Sep. 26, 2002, D58, p. 1763.*
Zheng et al. "Screening of protein crystallization conditions on a microfluidic chip using nanoliter–size droplets", J. Am. hem. Soc., 2003, v. 125, pp. 11170–11171.*
L.C. Sieker; *Microdialysis Crystallization Chamber*, Journal of Crystal Growth 90 (1998), pp. 349–357; North–Holland, Amsterdam.
Patricia C. Webber; *Physical Principles of Protein Crystallization*; Advances in Protein Chemistry, vol., pp. 1–36.

* cited by examiner

Primary Examiner—Yelena G. Gakh
(74) Attorney, Agent, or Firm—Lahive & Cockfield, LLP; Elizabeth A. Hanley, Esq.; Anthony A. Laurentano, Esq.

(57) ABSTRACT

A system for crystallizing a protein and other biomolecules comprises a flow channel for conveying a solution containing the biomolecule to be crystallized and one or more substations related to the crystallization process formed along the flow channel. The system operates by flowing a biomolecule solution through a the flow channel, then performing dialysis on a micro-scale to set crystallization conditions. After dialysis, the concentration of the biomolecule solution is changed by removing water or solvent from the biomolecule solution to promote formation of crystals in a segment of the flow channel. Formed crystals may be observed and harvested from the flow channel.

9 Claims, 8 Drawing Sheets

MICROFLUIDIC CHIP FOR BIOMOLECULE CRYSTALLIZATION

RELATED APPLICATIONS

The present application claims priority to U.S. Provisional Patent Application Ser. No. 60/427,620, filed Nov. 19, 2002, entitled "Microfluidic Chip for Protein Crystallization", U.S. Provisional Patent Application Ser. No. 60/409,489 filed Sep. 9, 2002, and U.S. Provisional Patent Application Ser. No. 60/410,685, filed Sep. 13, 2002. The present application is related to U.S. patent application Ser. Nos. 10/028,852, 10/027,484, 10/027,516 and 10/027,171. The present application is further related to an application Ser. No. 10/328,932 entitled "Microfabricated Two-Pin System for Biomolecule Crystallization," filed on even date herewith. The contents of each of the foregoing applications are expressly incorporated herein by reference.

FIELD OF THE INVENTION

The present invention relates to a microfluidic system and method for crystallizing biomolecules, such as proteins.

BACKGROUND OF THE INVENTION

The understanding of specific properties, functions and three-dimensional structure of proteins is an invaluable asset for understanding protein-ligand interaction and rational drug design. From the basic biochemical standpoint, for example, information on the three-dimensional structure of protein or the like is the basis to understand the functional role of molecules in a biochemical system.

In analyzing the structure of proteins, it is generally desirable to grow X-ray diffraction quality crystals from small quantities of a biomolecule. However, structural analysis of protein is currently a labor-intensive, lengthy process that requires significant consumption of expensive macromolecules and reagents. With the advent of robust expression and protein purification systems, high intensity, synchrotron x-ray sources and computer based methods of solving diffraction patterns, a rate limiting step in structural studies lies in rapidly growing x-ray quality crystals from small quantities of biomolecule.

SUMMARY OF THE INVENTION

The present invention provides for methods and hardware for growing crystals of biological macromolecules using real-time, or dynamic, control of parameters that promote crystal growth from protein solution. Prior crystallization devices available for high throughput screening of crystallization conditions are incapable of addressing at least some of the features listed below. The present invention provides a microfluidic chip for crystallizing proteins or other biomolecules. The system can grow 5–50 micron size, x-ray quality protein crystals from nanogram quantities of protein. The crystallization chip of the invention allows protein crystallization condition studies to be performed when only a few micrograms of a protein are available.

The protein crystallization system of the present invention operates by flowing a protein-containing solution through a microchannel, then performing dialysis on a micro-scale to set crystallization conditions. Effects such as change in ionic strength, change in detergent concentration, change in protein concentration and change in pH have been implicated in protein crystallization and may be used to effect or promote crystallization, any or all of which may be used in the present invention. The crystallization conditions may be set by exchanging ions, water, small molecules, buffer, pH or other dialyzable effectors of crystallization, and/or by locally controlling the temperature in the microchannel. After dialysis, the concentration of the protein solution is changed by removing buffer through a protein impermeable membrane or by evaporating water out through an aperture in the microchannel into an atmosphere of controlled temperature and humidity.

The protein crystallization system of the invention is formed by locating several stations in series along a single flow channel. The system comprises a protein channel for conveying a protein solution containing a protein to be crystallized and an effector station located along the protein channel for selective exchange of solutes between the protein channel and a buffer channel or reservoir by dialysis. A concentration station may also be located along the protein channel for concentrating the protein solution after dialysis. The concentration station may remove water or solvent from the protein solution through a protein impermeable membrane or by evaporation through an aperture in the side wall of the protein channel. The concentration station is followed by a crystallizing region of the protein channel in which crystallization can take place. The protein crystallization system may further include an observation station or region formed along the protein channel. The observation station provides means to monitor each crystallization process, in real time, by polarized light optics to detect presence of crystals or light scattering optics to detect protein aggregation. This allows fine adaptive control of the automation system. A harvesting station may be located downstream from the observation station to provide a means to transfer the crystals from the formation location to the x-ray diffraction apparatus in which crystals are observed to form by optical means. The harvesting station may harvest the crystal by removing an aliquot of liquid containing a crystal from the channel for freezing and x-ray structure analysis.

An automated system for testing 600–1000 protein crystallization conditions can be built by arraying a plurality of protein crystallization systems in series and/or in parallel. Such an automation system can then test 600–1000 different protein crystallization conditions in a single day using only micrograms of protein for the entire condition test series.

The present invention may be used to facilitate structural and functional genomics of cancer by developing and applying crystallization tools for structural analysis of proteins involved in cancer.

BRIEF DESCRIPTION OF THE FIGURES

FIG. 1$b$ illustrates a crystallization system according to an alternate embodiment of the invention.

DETAILED DESCRIPTION OF THE INVENTION

Figure 1A:
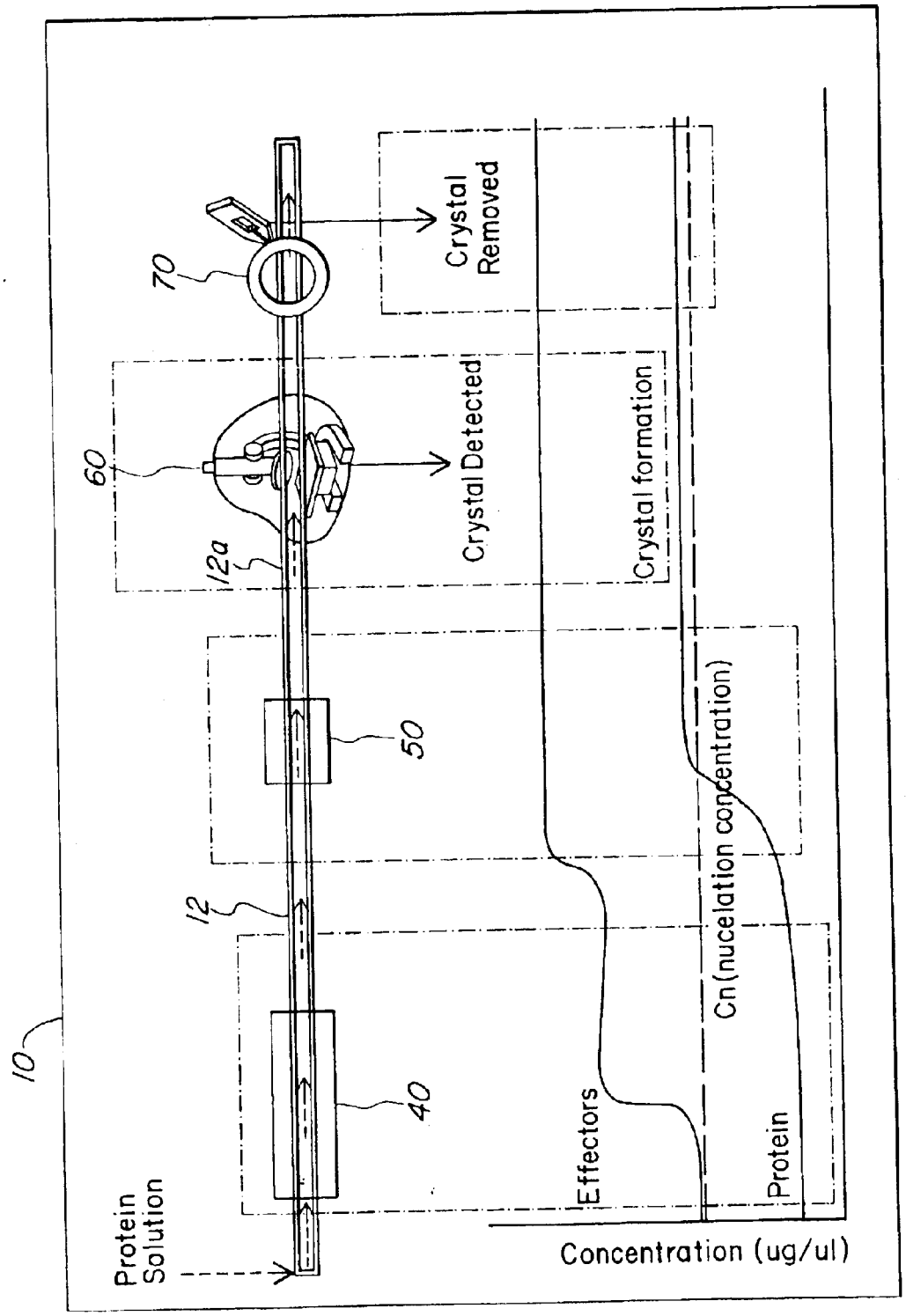
FIG. 1$a$ is a schematic view of a crystallization system of an illustrative embodiment of the invention.

The present invention provides a microstructured crystallization system that can be formed on a microfluidic chip. The crystallization system may be used to make single crystals from nanogram quantities of protein or other biomolecule, or to test 600–1000 crystallization conditions from microgram quantities of protein or other biomolecule. The present invention will be described below relative to an illustrative embodiment for crystallizing proteins. Those skilled in the art will appreciate that the present invention may be used to crystallize any desired biomolecule or create co-crystals of any combination of biomolecules and may be implemented in a number of different applications and embodiments. The present invention is not specifically limited in its application to the particular embodiments depicted herein.

The biomolecule crystallization system of the present invention integrates conventional membrane filter technology into a microfluidic chip to perform microdialysis or microfiltration on a flow in a microchannel. The biomolecule crystallization system sets conditions for crystallization of a biomolecule in solution by exchange of solutes through a membrane. The invention will be described below relative to a protein crystallization process, though one skilled in the art will recognize that the crystallization system may be used to crystallize any suitable biomolecule. The crystallization system is a robust, easy to use, automatable microfluidic system for high throughput crystallization of biological molecules. The crystallization system may be used to grow crystals of biological macromolecules from nanogram amounts of pure material.

As used herein, the term "microfluidic system" refers to a system or device for handling, processing, treating, purifying and/or analyzing a biological sample including at least one component having microscale dimensions.

The term "channel" as used herein refers to a pathway formed in or through a medium that allows for movement of fluids, such as liquids and gases. The term "microchannel" refers to a channel preferably formed in a microfluidic system or device having cross-sectional dimensions in the range between about 1.0 $\mu$m and about 500 $\mu$m, preferably between about 25 $\mu$m and about 200 $\mu$m and most preferably between about 50 $\mu$m and about 150 $\mu$m.

The term "membrane" or "filter" as used herein refers to a material of any suitable composition and size which may used to separate or filter substances in solution by size exclusion or other measures.

The terms "protein solution" or "biomolecule solution" include a solution comprising a molecule to be crystallized, e.g. protein or biomolecule.

The term "protein" is exemplary and it is understood that the present invention can be used to crystallize materials susceptible or capable of being crystallized under the conditions described herein. For example, molecules that can be used with the present invention include proteins, nucleic acids, e.g., DNA or RNA, cofactors, substrates, substrate analogs, or derivatives of any of these molecules. Further, the present invention is intended to be used with fragments of biomolecules, e.g. peptides or nucleic acid fragments. The present invention is also intended to be used with modified, e.g., in vivo or in vitro, macromolecules. For example, protein molecules can be modified in vivo, e.g., glycosylated, myristolated, or adenylated. Alternatively, protein molecules may be modified in vitro, e.g., chemically modified.

The terms "effector" or "effectors" represent all the possible solutes or components or conditions of a buffer that might be set as the conditions to promote crystallization. The terms include, but are not limited to, ions, pH, temperature, detergents, and other molecules and components known to those skilled in the art of biomolecule crystallization.

The term "integration ratio" means the ratio of protein incorporated into the crystal as compared to the total amount of protein consumed in attempting to grow a crystal. In a major improvement over other crystallization techniques, the present method allows crystal growth from small amounts of purified macromolecule. The crystals resulting from this new method are comparable in size to crystals grown by other techniques, despite using approximately two orders of magnitude less starting material. In one embodiment the integration ratio of polypeptide in the crystal as compared to total protein used to grow the crystal is 1:50, 1:100, 1:150, 1:200, 1:250, 1:300, 1:400, 1:500, 1:750, 1:1000, 1:1500, 1:2000, 1:2500, 1:3000, 1:4000, 1:5000, 1:6000, 1:7500, 1:10,000, 1:20,000, 1:30,000, 1:40,000, 1:50,000. It should be understood that any of the above ratios can be the beginning or end point for a range of ratios over which the instant invention is intended cover.

The term "static crystallization condition" is defined wherein the various parameters that effect crystallization are varied by mixing macromolecules with different effectors including buffers, precipitating agents, additives, ligands and, substrates.

In conventional crystallization experiments static conditions are set and the solution conditions are then allowed to "drift." The term "drift" means allowing the various effectors in crystallization conditions to change in an uncontrolled manner until crystallization takes place or such a length of time passes that one gives up on that set of static conditions. For example, in a currently available hanging drop method concentration of protein in the drop is allowed to equilibrate with the reservoir solution so that the concentration of the protein in the drop increases at an uncontrolled rate till the crystals appear in the drop. In conventional systems "static conditions" followed by "drift" as described above are employed to test for each successful crystallization condition.

The term "dynamic open-loop condition" is defined wherein an effector is set to vary at a controlled rate and the rate is pre-set. For example one might set the pH to be varied by 0.05 pH units per second or set the protein concentration to increase by 0.5 mg/ml per second.

To apply dynamic open-loop conditions, one must be able to control effector levels with a useful precision that is preferably better than 30% of the full scale variation and most preferably better than 10% of the full scale variation and do so over a useful rate that is preferably over minutes and most preferably over seconds.

The term "dynamic closed-loop condition" is defined by an effector being set to be varied from an initial setting in response to a program that takes into account real time observations of the crystallization process. In one example the protein concentration is set to increase at 0.5 mg/ml per second until a crystal is observed to start forming and after that time the protein concentration is held fixed. In another example the NaCl concentration is set to increase at a rate of 100 mM/sec until a crystal is observed to initiate and then the NaCl concentration is reduced by 10 mM/sec until the crystallization process is completed. By changing an effector in response to the development of the first crystal one may avoid the formation of multiple crystals.

To apply dynamic closed-loop conditions, one must be able to control effector levels with a useful precision that is preferably better than 30% of the full scale variation and most preferably better than 10% of the full scale variation and do so over a useful rate that is preferably over minutes and most preferably over seconds. One must also be able to observe the process of crystallization or the state of the crystallization solution in real time in order to make controlled changes in the target effector levels in response to those observations.

The ability to use either open or closed loop dynamic conditions for crystallization is particularly significant because the quality and number of crystals formed is strongly sensitive to the dynamics of the crystal formation process.

In the most general type of conditions for crystallization wherein some set of effectors are to be set, some of those effectors may be static conditions, some may be open-loop dynamic conditions and some may be closed-loop dynamic conditions. The rates of change set for the effectors subject to open-loop dynamic conditions may be the same or they may be different. The rates of change and the response program for effectors subject to closed-loop dynamic conditions may be the same or they may be different. Certain methods of effector change such as evaporation are only suited for changing all molecular concentrations in the test solution simultaneously and at the same rate. Microdialysis and microfiltration can be used to change the concentrations of different molecules at different rates.

The "response time" of a system for changing effector levels is the minimum time required to change an effector and have it equilibrate through the solution. For this purpose working with smaller volumes reduces response time of any system. In particular the current invention associated with dynamically changing effector levels in nanoliter scale volumes is preferred over those using larger volumes.

The term crystallization "condition space for a set of effectors" means all the possible ways to set those effectors in experiments to test for crystallization. This includes using static, open-loop dynamic and closed-loop dynamic settings. The condition space, for a set of effectors that includes the open-loop dynamic and closed-loop dynamic options is larger than the condition space for that set of effectors without those options.

The term "useful in structural determination" refers to crystals that can be harvested from the crystallization trial and subjected to x-ray crystallography. The methods of the present invention allow for testing of many sets of crystallization conditions and, unlike the methods currently available in the art, allow for removal of crystals from the microfluidic chip to be used in x-ray crystallographic structural determination.

FIG. 1a is a schematic illustration of a crystallization system according to an embodiment of the invention suitable for crystallizing proteins and other biomolecules. The invention will be described relative to crystallization of proteins, though one skilled in the art will recognize that the invention covers crystallization of any suitable material. The crystallization system 10 of the present invention is implemented in a microfluidic chip. The crystallization chip allows for screening of crystallization conditions to promote growth of quality single crystals for molecular structure determination by X-ray diffraction. The microfluidic system comprises a substrate having one or more flow paths formed therein, as well as one or more subsystems for handling a protein or biomolecule solution during a crystallization process. The illustrative crystallization system comprises flow channels formed in a substrate composed of a thin transparent glass or plastic structure, though one skilled in the art will recognize that any suitable material may be used according to the teachings of the invention.

The crystallization process includes three stages: nucleation, crystal growth and cessation of crystal growth. During nucleation, an initial cluster of molecules associate in three dimensions to form a thermodynamically stable aggregate. Crystals form in supersaturated solutions in which the protein concentration exceeds a nucleation concentration. Crystal growth ceases when the protein solution is sufficiently depleted of protein molecules or when other conditions change to modify the nucleation concentration. Proteins are generally induced to crystallize by adding agents that either alter their surface chargers or perturb the interactions between the protein and bulk solvent water to promote associations that lead to crystallization.

The illustrative crystallization system 10 of the invention comprises a protein channel 12 for conveying a protein solution containing a molecule to be crystallized. One or more substations 40, 50, 60, 70 for unit processes useful in protein crystallization are disposed along the flow channel. Each substation 40, 50, 60, 70 of the protein crystallization system is arranged along the main channel to enable a broad class of crystallization condition trials to be tested in the system 10.

In the present invention, controlled laminar flow of the crystallization material through the protein channel 12, as well as the presence of one or more effector setting substations 40 and one or more concentration change substations 50 allows for crystal growth by microscale dialysis or vapor diffusion methods.

As shown in FIG. 1a, a first substation may comprise an effector setting station 40 located along the protein channel 12 for setting effectors in the protein containing buffer by dialysis. FIG. 1a also graphs the concentration of a protein solution and effectors through each substation region of the protein channel 12. As shown, initially, the protein concentration of the protein solution in the protein solution is less than the nucleation concentration. The effector change station 40 allows for the selective exchange of solutes between a buffer in a buffer channel and the protein solution in the protein channel to set crystallization conditions. At the effector change station 40, the effectors of the protein solution may be varied to promote crystallization by dialysis between the protein channel and a buffer separated from the protein channel by a protein impermeable membrane. For example, crystallization conditions may be set by salting in or salting out of the proteins, changing the buffer type and concentration, exchanging ions, ligands and/or cofactors, varying the pH of the solution, varying the temperature of the solution or other means known in the art.

Another station along the protein channel 12 is a concentration change station 50 which increases the concentration of protein and effectors in the protein solution by removing water (or other solvent) from the protein solution by filtration or by evaporation. The concentration station increases the concentration of the protein solution above the nucleation concentration to initiate nucleation and promote subsequent growth of a crystal.

In addition to the effector setting station 40 and concentration station 50, the protein crystallization system 10 may further include an observation station 60 or region along the protein channel and a harvesting station 70. At the observation station 60 optical means may be used to observe the aggregation of protein molecules or the formation of crystals. The optical means may also be used to measure the velocity of crystals in the flow. The illustrative observation station 60 may use polarized light optics to detect the presence of crystals by imaging or light scattering optics to detect protein aggregation. The observation station allows fine adaptive control of the system by observing the formation process and providing feedback to the different components. The harvesting station 70 provides a means to extract the crystals from the protein channel where the crystals are formed to devices suitable for placing the crystals in x-ray diffraction apparatus.

The arrangement of the different stations can be varied according the requirements of a particular crystallization trial. One skilled in the art will recognize that the protein crystallization chip may include one or more of the described substations in any suitable combination.

Figure 1B:
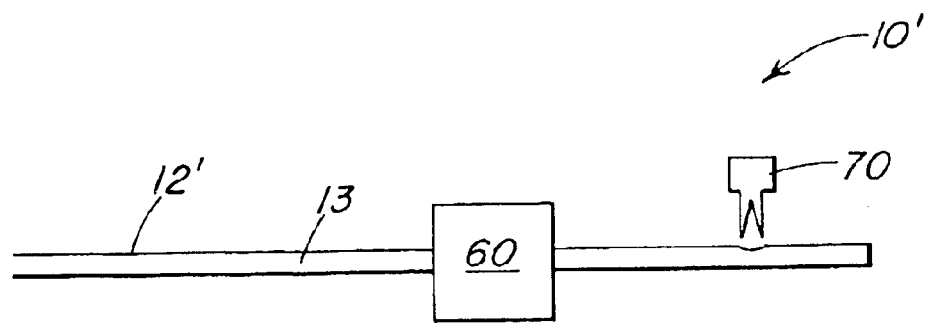

According to an alternate embodiment of the present invention, shown in FIG. 1b, a protein crystallization system 10' comprises a crystal channel 12' that conveys formed crystals 13 and an observation station 60 and/or a harvesting station 70 provided along the crystal channel for extracting the crystals from the channel. Any suitable means for forming the crystals in the crystal channel may be used in the embodiment shown in FIG. 1b.

Figure 2:
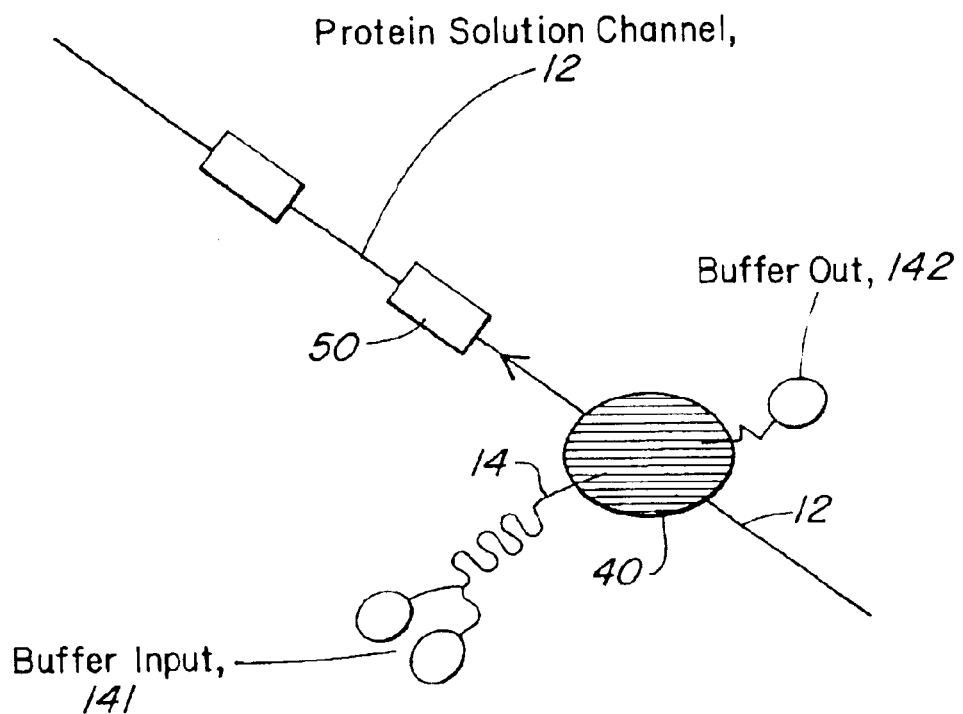
FIG. 2 is a detailed view of a portion of a crystallization system.
Figure 3A:
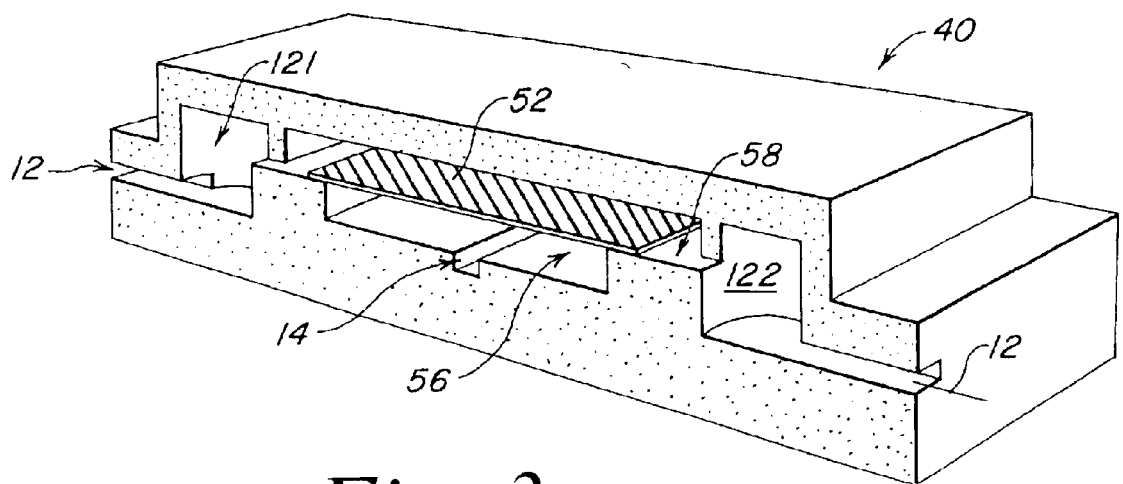
FIGS. 3$a$ and 3$b$ illustrate an effector change substation of the crystallization system.
Figure 3B:
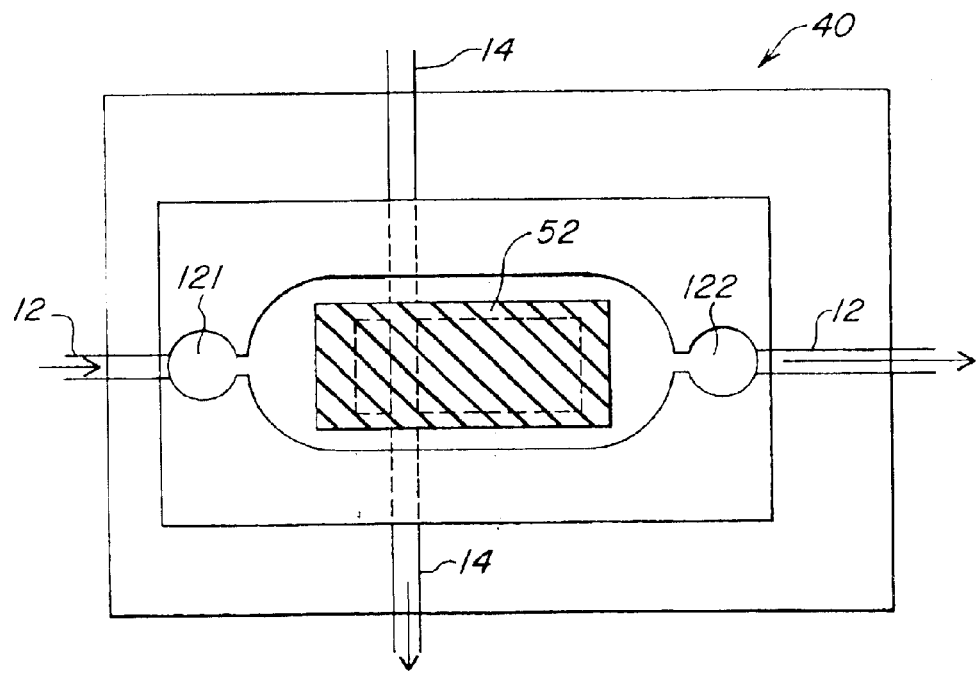

FIGS. 2 and 3a and 3b illustrate the effector change substation 40 of an illustrative embodiment of the invention. As shown, the effector change substation utilizes a conventional membrane filter 52 separating two flow paths, (i.e., the protein channel 12 and the buffer channel 14) to provide small volume controllable dialysis of a sample. The illustrative effector change system is a four-port transverse filter, which includes the protein channel 12 for supplying the protein solution to the effector change station 40 and the buffer channel 14 for supplying a buffer solution from a buffer input region 141 to the filtration station. The protein channel 12 intersects the effector change substation at a first inlet 121 and an outlet 122 from the filtration chamber for receiving and conveying the dialyzed protein solution from the effector change substation. The buffer channel 14 includes a chip inlet 141 for inputting buffer solution to the chip 10 and a chip outlet 142 for removing the used buffer solution from the chip. The buffer channel 14 intersects the filtrate chamber below the membrane 52 at a second inlet includes a second outlet for transferring buffer solution from the effector change substation.

A suitable effector change substation is described in U.S. Provisional Patent Application No. 60/410,685 filed Sep. 13, 2002, entitled "Microfabricated On-Chip Particle Filtration System", the contents of which are herein incorporated by reference and U.S. patent application Ser. No. 10/329,018 entitled "Implementation of Microfluidic Components in a Microfluidic System" filed on even date herewith.

The protein solution containing the molecule to be crystallized is introduced to the effector setting subsystem from the protein channel 12 and passes into the first filtration chamber 58 and over the membrane 52. The buffer solution is introduced into the second filtration chamber 56 below the membrane 52. The protein solution is dialyzed, and solutes are exchanged through the membrane to promote crystallization of the protein. As described above, protein crystallization may be promoted or effected by setting effectors, such as changing the ionic strength of the protein solution, changing the detergent concentration, changing the protein concentration or changing the pH of the sample.

The effector setting substation 40 allows for selective exchange of solutes of particular size. An appropriate filter membrane may be selected to allow for exchange of specific ions, ligand and cofactors between the buffer and protein channels. Solutes are allowed to pass through the membrane to the protein channel and may be driven by pressure towards collection wells. Diffusion across the membrane can be passive size selective flow of solutes or can be controlled by pressure and flow rate along the buffer channel.

Figure 4:
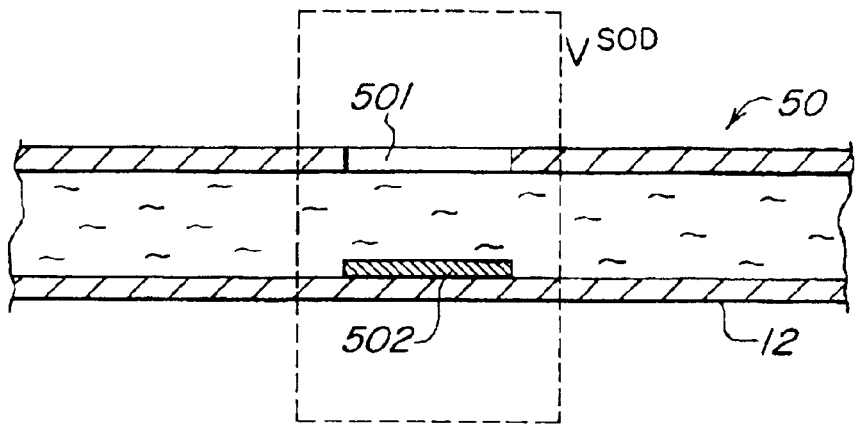
FIG. 4 illustrates embodiment of a harvesting station of a protein crystallization system of an illustrative embodiment of the invention.

FIG. 4 illustrates an embodiment of the concentration station 50, wherein the concentration station 50 comprises an evaporation station 500 for controlled evaporation of water or other solvents from the protein solution to increase the protein concentration. According to the embodiment of FIG. 4, the evaporation substation 500 is formed by an aperture 501 formed in a sidewall of the protein channel 120, though one skilled in the art will recognize that other suitable means for controllably evaporating the crystallization solution may be used. The rate of evaporation can be controlled by controlling the temperature of the protein solution, for example using a local heater 502 disposed in, along or in the vicinity of the aperture 501. The rate of evaporation can also be controlled by controlling the temperature and humidity of the atmosphere above the aperture 501, the size of the aperture in the protein channel defining the evaporation station, and/or the flow rate of the protein solution in the protein channel 12. Fine control of temperature on the evaporation substation provides means to vary the evaporation profile of the crystallization solution and therefore change in rate of concentration of protein.

Figure 5:
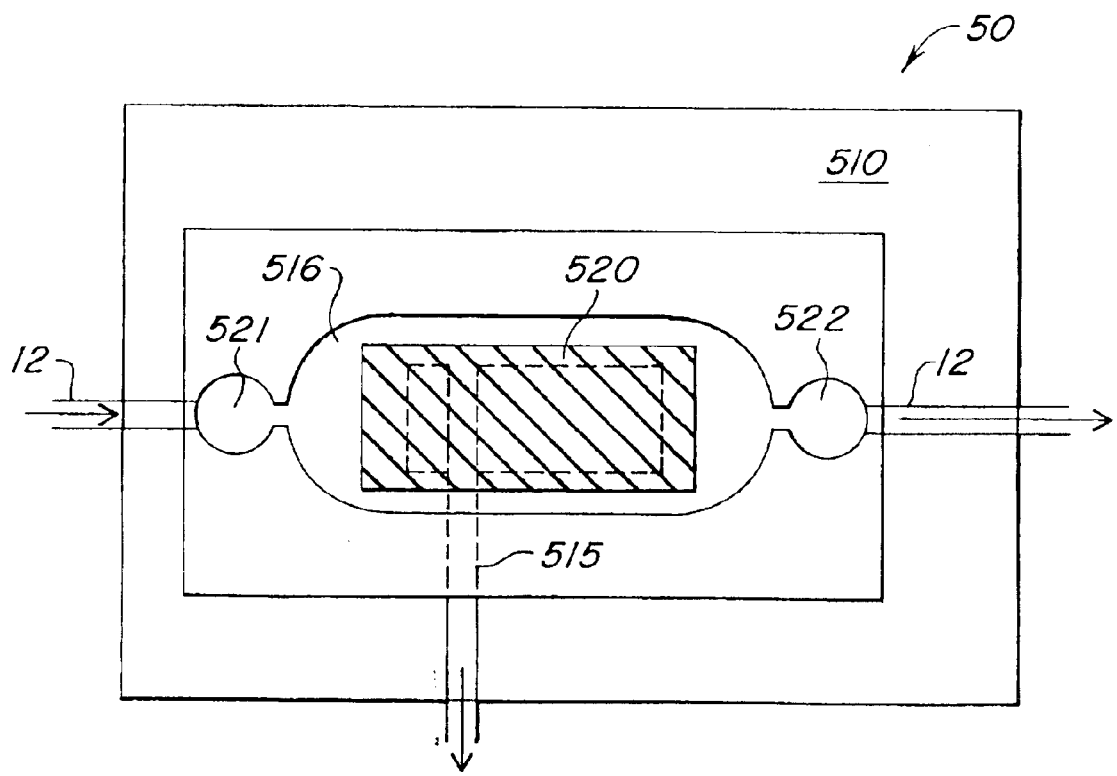
FIG. 5 illustrates an embodiment of a concentration change station in a protein crystallization system of the present invention.

According to another embodiment, shown in FIG. 5, the concentration station comprises a filtration station 510 which allows controlled removal of water (or other solvent) from the protein solution through a membrane impermeable to the protein to be crystallized. According to the embodiment of FIG. 5, the filtration station 510 has a configuration similar to the effector setting station shown in FIGS. 2 and 3. The illustrative concentration station 510 includes a protein impermeable membrane 520, a protein chamber 516 formed above the membrane and connecting to the protein channel 12 via an inlet 521 and outlet 522. However, rather than exchanging solutes through the membrane 520, the filtration station 510 uses an applied pressure or other suitable means to transport water or other solvent out of the protein solution and through the protein impermeable membrane 520. The water of solvent may be transported to a filtration channel 515 or chamber formed below the membrane 520 and disposed of or re-used. One skilled in the art of dialysis will recognize that the membrane may be selected to block only the protein or block both the protein and some of the effectors in the protein buffer as a way of controlling which components concentration is increased by this kind of filtration station.

After setting the conditions for crystallization, the protein solution, now ready to form protein crystals, flows into the observation station 60 formed along a crystallizing segment 12a or region of the protein channel 12 where the crystals form. According to the illustrative embodiment, the presence of crystals in the protein channel 12 may be observed by polarizing microscope optics. The initial formation of crystals, i.e., the presence of protein aggregate in the protein channel 12 can also be monitored by the observation station using light scattering optics.

The observation station 60 allows each crystallization experiment to be monitored in real time, by CCD camera and polarized light optics to detect the presence of crystals or light scattering optics to detect protein aggregation. The ability to monitor the crystallization process, i.e., the successful formation of crystals or the failure to form crystals, in real time allows for adaptive tuning of crystallization condition setting algorithms. The observation station 60 may also measure the velocities of any crystals formed in the flow in order to predict when they will arrive at the harvesting station 70.

Figure 6:
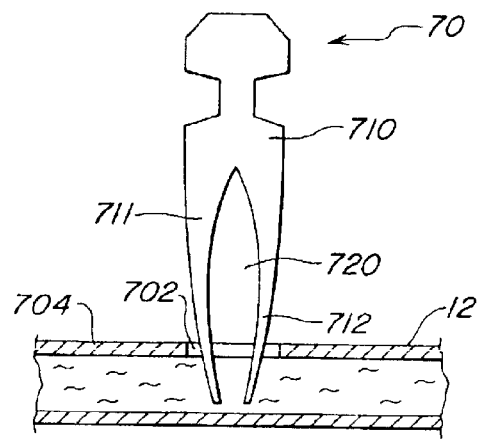
FIG. 6 illustrates another embodiment of a concentration change station in a protein crystallization system of the present invention.

After detection of the crystals, the harvesting station 70 may extract the crystals from the channel 12. The illustrative harvesting station 70 extracts an aliquot of liquid containing the crystal using a suitable subsystem. The illustrative harvesting station 70, an embodiment of which is shown in FIG. 6, may comprise a microfabricated two-pin and virtual wall system described in U.S. Pat. Ser. Nos. 10/028,852, 10/027,484, 10/027,516 and 10/027,171, the contents of which are herein incorporated by reference. As shown in FIG. 6, the harvesting station 70 comprises an aperture 702 formed in a sidewall 704 of the protein channel 12, which provides access to the interior of the protein channel and a harvesting device 710. According to the illustrative embodiment, the harvesting device comprises a capillary uptake pin, illustrated as a microfabricated two-pin device comprising a first pin 711 spaced from a second pin 712 to define a capillary-sized sample acquisition region or channel 720. The aperture 702 is sized and dimensioned to form a meniscus of the protein solution in the aperture. When the formed crystal nears the aperture 702, the capillary uptake pin 710 is introduced into the protein channel interior through the aperture 702 to extract the crystal. The capillary uptake pin 710 wicks up a fixed volume of liquid including the crystal from the protein solution. The capillary region 720 of the pin 710, i.e. the space between the two pins 711, 712 in a two-pin device, holds an aliquot of liquid including the crystal by capillary action. The capillary uptake pin 710 is then removed from the aperture 702 carrying away the aliquot of liquid containing the desired crystal. One skilled in the art will recognize that any suitable subsystem for extracting material from microchannels may be used in accordance with the present invention.

According to an illustrative embodiment, the crystals may be extracted and frozen in place on the harvesting device 710, which eliminates the need to transfer the crystal to a separate structure for freezing and observation.

Figure 7:
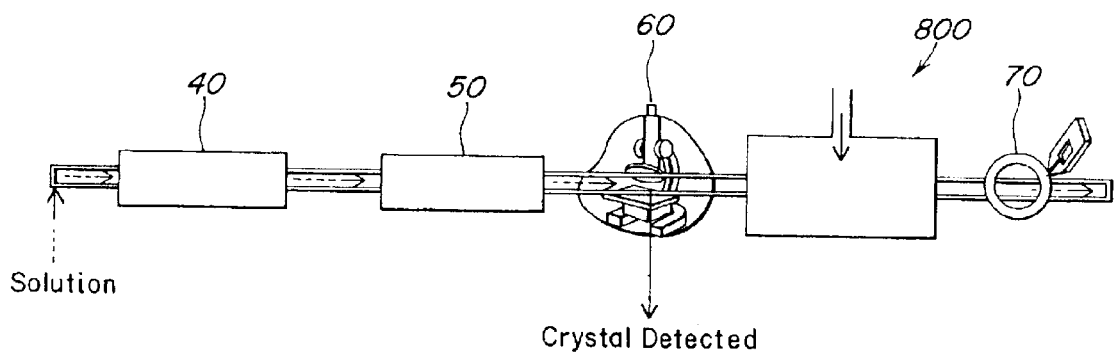
FIG. 7 illustrates a crystallization system including a soaking station.

According to another embodiment of the invention, shown in FIG. 7, the protein crystallization system may also include a soaking station 800 for adding compounds to the formed crystal in the protein channel. The soaking station allows for the introduction of cofactors, or potential ligands, e.g., inhibitors or activators, to a preexisting crystal.

The protein crystallization system of the present invention can grow 10–50 micron size protein crystals from nanogram quantities of protein, which allows protein crystallization studies testing 100's to 1000's of conditions to be performed when only a few micrograms of a protein are available.

The protein crystallization system provides a fully automated system in which crystallization trials can be run at a rate of about 1 per minutes on a single channel. The system includes easy automatable means to harvest crystals from the formation location for x-ray data collection.

The present invention enables protein crystallization trials using microfluidic systems, with filtration subsystem used to exchange for solutes, for example for salting-in or salting-out of protein. In comparison with conventional high throughput crystallization systems, the protein crystallization system of the present invention reduces the consumption of precious sample and reagents by at least two orders of magnitudes. The effector change substation and the filtration substation have fairly simple constructions and are adaptable to any filter for which an appropriate adhesive to glue the filter to the substrate material is available.

One skilled in the art will recognize that the protein crystallization chip is not limited to the illustrative sequence and arrangement of subsystems and that several different embodiments of the protein crystallization chips may be designed with different sequences and arrangements of evaporation, filtration, observation and harvesting substations.

Figure 8:
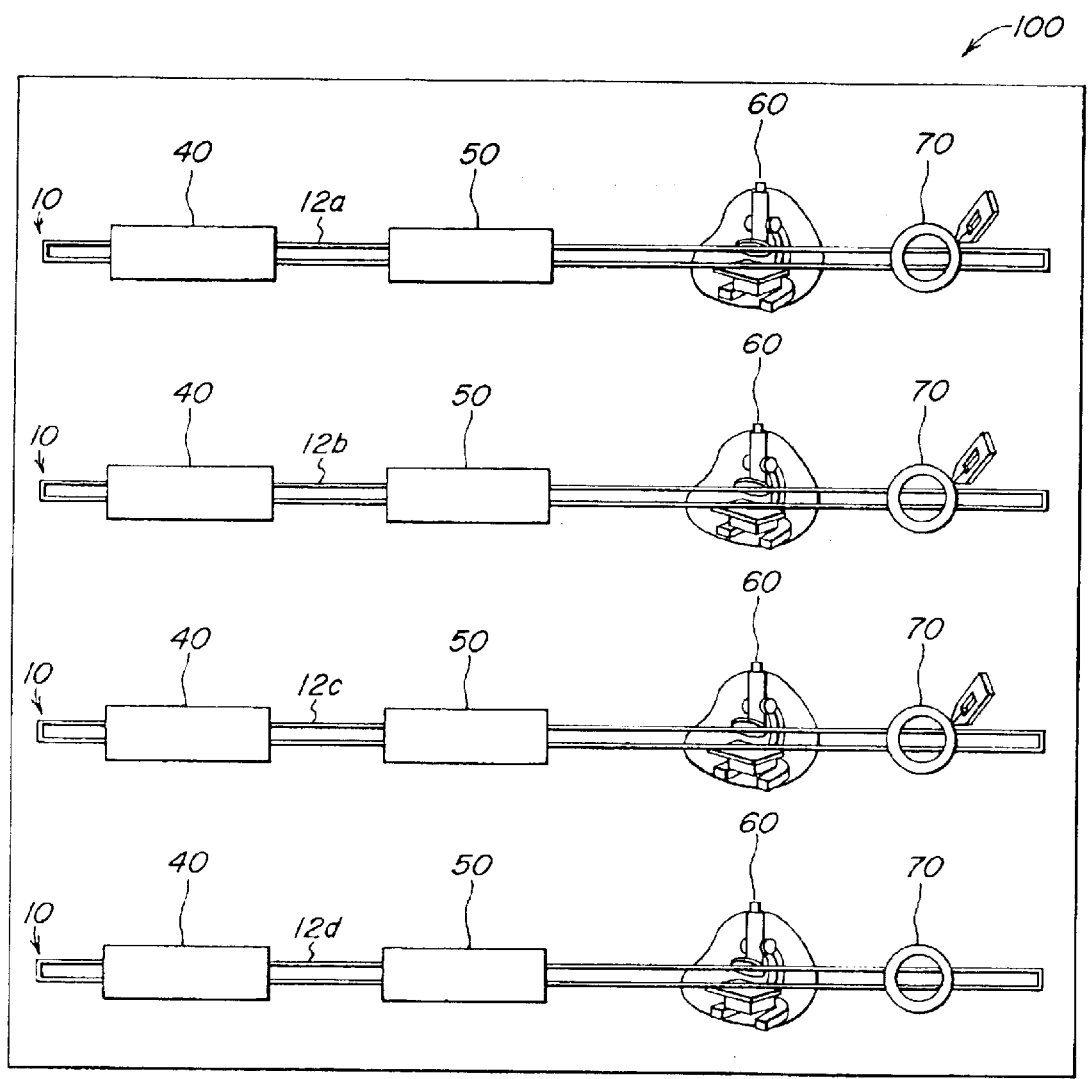
FIG. 8 illustrates a microfluidic chip including a plurality of crystallization systems in parallel.

According to one embodiment, a plurality of different protein crystallization systems 10, each comprising a protein channel 12a, 12b, 12c, 12d and one or more substations 40, 50, 60 and/or 70 may be arranged on a single substrate 100 and operated in parallel, as shown in FIG. 8. The use of parallel systems on a single substrate increases throughput, while effectively utilizing resources.

Figure 9:
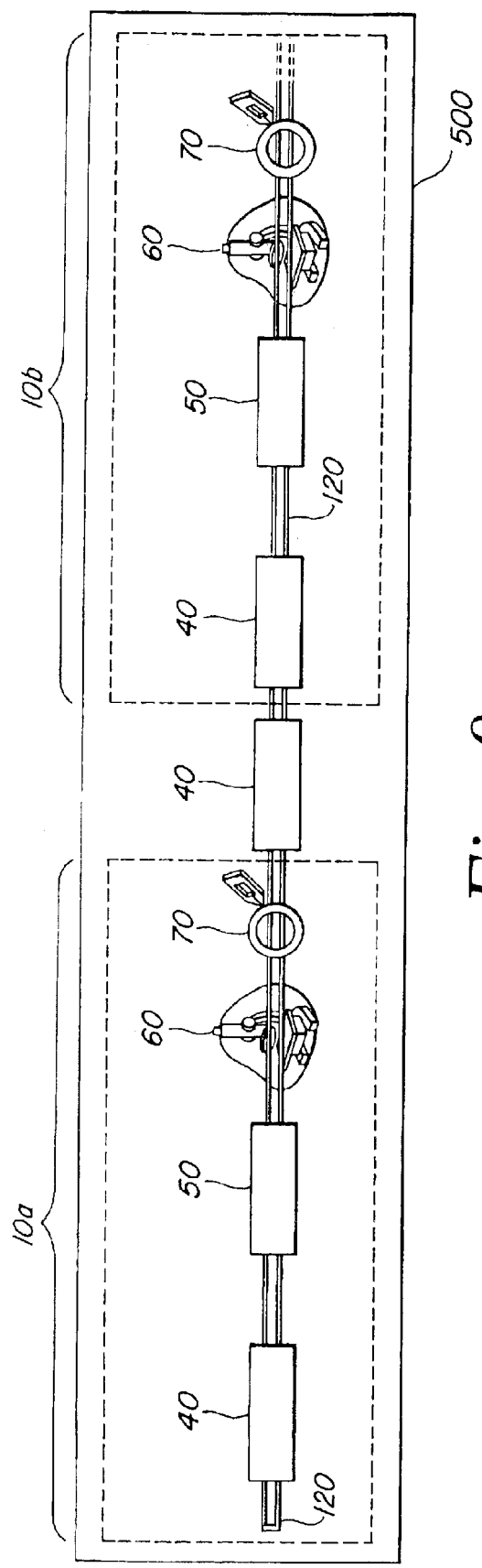
FIG. 9 illustrates a microfluidic chip including a plurality of crystallization systems in series.

According to another embodiment, a protein crystallization chip 500 may comprise a plurality of protein crystallization systems 10a, 10b in series, as shown in FIG. 9. As shown, the chip 500 includes a single protein channel 120 extending through and connecting each crystallization system 10. The substations 40, 50, 60 and/or 70 associated with each system 10 are formed along the protein channel 120. Each system along the channel 120 prevents target protein from leaving the protein channel 120, except in the form of successful crystals at the harvesting station 70. Therefore, the arrangement of a plurality of systems in series minimizes loss of protein involved in running one crystallization experiment, including evaporation and dialysis stations. Therefore, if a first protein crystallization system 10a operating under a first set of crystallizing conditions does not produce a crystal, the protein solution in the channel 120 can continue on to another crystallization system 10b positioned in series along the channel to attempt crystallization under the same or a different set of crystallizing conditions. A single channel can potentially have tens to hundreds of crystallization systems positioned serially. One skilled in the art will recognize that the particular arrangement of substations is illustrative of one embodiment of the invention and that each protein crystallization system 10 may comprise one or more of the described substations 40, 50, 60 and 70 in any suitable combination.

In a protein crystallization chip comprising a plurality of crystallization systems in series, the conditions in the protein channel 120 may be re-set between each system 10 by including an effector setting station 40, such as a dialysis system subsystem, to dialyze the protein solution in the channel and a filtration subsystem, such as the concentration system of FIG. 9 to add water before passing the protein solution to a subsequent system. One skilled in the are of filtration and dialysis will recognize that one may also configure the effector change and concentration change subsystems in any system to set the new crystallization conditions based on the previous systems output conditions rather than the original input conditions. Further, one skilled in the art of filtration and dialysis will realize that the filter arrangement of the present invention allows for the evaporation of any solute in the crystallization mixture.

A serial arrangement of one or more protein crystallization systems 10 efficiently produces large numbers of trials per mass of protein, since in each single crystallization system no protein is consumed (i.e. leaves the system) other than by successful crystallization. For example, a 2 mm injection plug of protein solution injected into a protein channel having cross-sectional dimensions of 100 um×50 um results in an injection of about 100 nl of protein solution into the system, for example at 1 nanogram/nanoliter. The 100 nl of protein solution may be fed into a serial arrangement of fifty protein crystallization systems, allowing for fifty crystallization trials to be performed using only the 100 nl of protein solution. At a mass per unit volume of 1 nanogram per nanoliter, the utilization of protein at high throughput is only 2 nanogram per crystallization trial.

Figure 10:
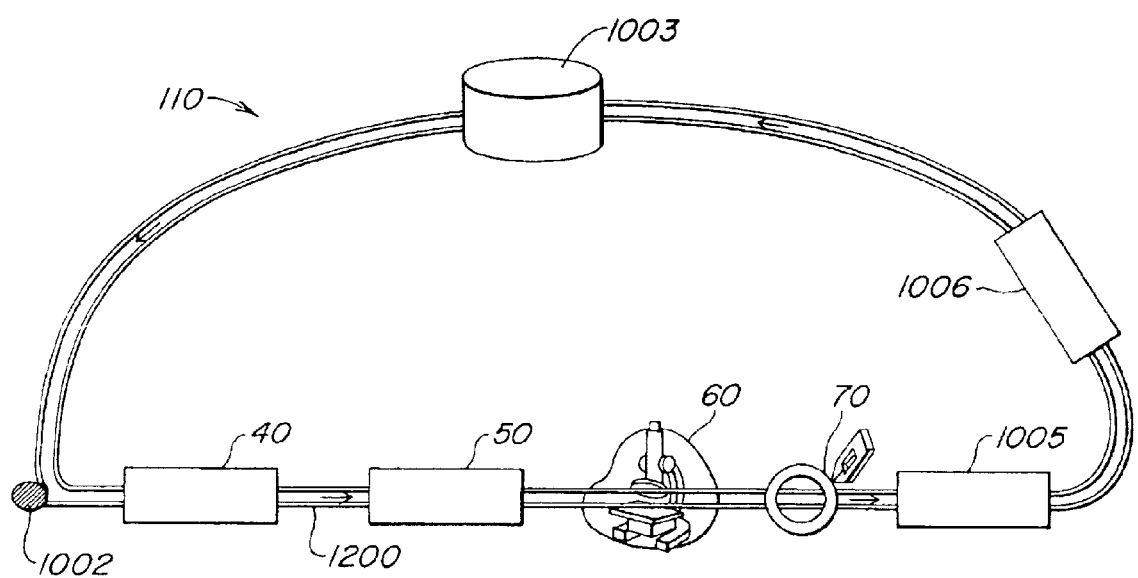
FIG. 10 illustrates a microfluidic chip including a looped crystallization system for performing multiple crystallization processes.

According to another embodiment, the protein crystallization system may be arranged in a fluid transport loop 110, as shown in FIG. 10, to allow multiple crystallization trials to be performed in a single crystallization system. The fluid transport loop allows the protein solution to be recycled and pumped back through the protein crystallization system multiple times. To operate the system, an initial protein solution is injected through a valve 1002, which is then closed. A pump 1003 operates to cycle the solution through the looped protein channel 1200 which includes a plurality of substations 40, 50, 60, 70 for crystallizing the protein. As described above, the effectors may be set in the protein solution via an effector setting station 40, followed by concentration of the protein solution at a concentration station 50, after which crystals may form in the protein channel. The crystallization may be observed at an observation station 60, followed by harvesting at a harvesting station 70.

If the conditions fail to produce a crystal, then the protein solution may be recycled back through the system to attempt crystallization under the same or a different set of conditions. As shown, the protein solution may continue through a concentration resetting station 1005 and a buffer resetting station 1006 before passing through the pump 1003. The pump 1003 pumps the protein solution into the upstream end of the crystallization system. The recycled protein solution may have the same effector/buffer conditions at which the protein was originally injected.

Having described operating protein crystallization systems in parallel, series and serial loops it will be clear to one skilled in the art that any combination of these is also part of this invention.

The protein crystallization chip of an illustrative embodiment of the present invention combines a method and device to control the evaporation and selective filtration of crystallization material for protein crystallization. While retaining all the advantages of the conventional high throughput crystallization methods and devices, protein crystallization chips overcomes many of its drawbacks. The present invention may be used to grow good quality, diffraction grade crystals by evaporation and dialysis membrane equilibration techniques. The present invention combines transverse filter technology and small volume dynamic fluid control, which is inherent in microfluidic systems.

The protein crystallization device of the present invention provides significant advantages over the prior art. The protein crystallization system allows for growth of picogram quantities of crystals from nanogram quantities of protein, which is a reduction by at least two order of magnitude in reagent and sample consumption compare to conventional high throughput crystallization systems. The present invention further provides the ability to design customized network of active fluidic system in a controlled sealed environment, as well as the ability for real time and automated monitoring of crystallization experiments by laser scattering (to monitor aggregate formation) and polarization microscope (presence of crystal). In the present invention, formed crystals can be easily harvested for flash freezing and data collection using a pin system or other suitable harvesting means. The present invention further allows for crystal growth via batch, liquid—liquid, dialysis and evaporation methods. The present invention uses lab-on-chip technology for accurate mixing and dispensing of crystal growth solutions. The present invention may be fully automated and is inexpensive, cost effective and easy to use. The protein crystallization chip enables a system that combines conventional dialysis membrane technology to provide exchange of solutes and controlled evaporation in a microfluidic network. The protein crystallization chip further exploits the advantages of microfluidic in minimizing the fluid volumes required.

One skilled in the art will recognize that the invention is not limited to crystallization of proteins and that the protein crystallization chip may be used to crystallize any desired biomolecule, including, but not limited to nucleic acids and other biomolecules.

In one embodiment, the crystals of the present invention are a family of crystals that are different space groups, e.g., geometries, symmetries, or unit cells, of the same polypeptides and nucleic acids. The present invention allows a skilled artisan to sample many more conditions, with much less protein and in a much shorter time period, than conventional techniques. These improvements make it more likely that different crystal forms of the same protein will be identified. Accordingly, the invention, at least in part, is a family of structures containing 3, 4, 5, 6, 7, 8, 9, 10, 15, 20 or 25 members that are related by the fact that they all contain the same non-solvent molecules, e.g., proteins, nucleic acids, cofactors, or substrates.

The present invention has been described relative to an illustrative embodiment. Since certain changes may be made in the above constructions without departing from the scope of the invention, it is intended that all matter contained in the above description or shown in the accompanying drawings be interpreted as illustrative and not in a limiting sense.

It is also to be understood that the following claims are to cover all generic and specific features of the invention described herein, and all statements of the scope of the invention which, as a matter of language, might be said to fall therebetween.

Having described the invention, what is claimed as new and protected by Letters Patent is:

1. A method of crystallizing a biomolecule, comprising the steps of:
   providing a biomolecule microchannel, comprising an inlet and an outlet;
   providing a first filter chamber in a fluid communication with the biomolecule microchannel and located between the inlet and the outlet, the first filter chamber comprising a membrane, wherein the membrane forms one of the sides of the first filter chamber;
   providing a buffer microchannel, comprising an inlet and an outlet;

providing a second filter chamber in a fluid communication with the buffer microchannel, the second filter chamber located between the inlet and the outlet of the buffer microchannel and separated from the first filter chamber by said membrane;

flowing a biomolecule solution containing the biomolecule through the biomolecule microchannel and the first filter chamber;

flowing the buffer solution through the buffer microchannel and the second filter chamber;

wherein the biomolecule solution in the first filter chamber is dialyzed through the membrane when in contact with the buffer solution in the second filter chamber; and a crystal of the biomolecule is formed in the dialyzed biomolecule solution.

2. The method of claim 1, wherein the step of dialyzing the biomolecule solution sets effectors in the biomolecule solution to promote crystallization of the biomolecule.

3. The method of claim 2, wherein the effectors comprise ions exchanged through the membrane.

4. The method of claim 2, wherein the effectors comprise the pH of the biomolecule solution.

5. The method of claim 2, wherein the effectors comprise the temperature of the biomolecule solution.

6. The method of claim 2, wherein the effectors comprise detergents that are exchanged with the biomolecule solution through the membrane.

7. The method of claim 1, further comprising the step of observing the crystal formation.

8. The method of claim 1, further comprising the step of harvesting the crystal formed during observation.

9. The method of claim 1, further comprising the step of freezing the crystal for x-ray diffraction.

* * * * *